United States Patent [19]

Beg

[11] Patent Number: 5,276,661
[45] Date of Patent: Jan. 4, 1994

[54] MASTER CLOCK GENERATOR FOR A PARALLEL VARIABLE SPEED CONSTANT FREQUENCY POWER SYSTEM

[75] Inventor: Mirza A. Beg, Lima, Ohio

[73] Assignee: Sundstrand Corporation, Rockford, Ill.

[21] Appl. No.: 553,514

[22] Filed: Jul. 18, 1990

[51] Int. Cl.⁵ .................................................. G04F 5/00
[52] U.S. Cl. ..................................... 368/155; 368/156; 368/46
[58] Field of Search ........................ 368/46, 48, 155–; 307/44, 46, 48, 87; 328/133; 331/25

[56] References Cited

U.S. PATENT DOCUMENTS

| | | | |
|---|---|---|---|
| 3,569,838 | 3/1971 | Blair | 331/2 |
| 4,321,706 | 3/1982 | Craft | 455/113 |
| 4,707,142 | 11/1987 | Baker et al. | 368/46 |
| 4,801,896 | 1/1989 | Phillips et al. | 331/25 |
| 4,849,704 | 7/1989 | Thornton | 328/133 |
| 4,935,706 | 6/1990 | Schenberg | 331/11 |

Primary Examiner—Tod R. Swann
Attorney, Agent, or Firm—Michael S. Yatsko

[57] ABSTRACT

A master clock generator for a variable speed constant frequency electric power system includes a frequency select circuit for selecting an external or internal frequency reference signal and a phase comparator for producing a phase error signal representative of the phase difference between the frequency reference signal and an output clock signal. The phase error signal is combined with a control signal to produce an adjusted phase error signal. This adjusted phase error signal is integrated and a voltage control oscillator is used to produce the output signal in response to the integrated adjusted phase error signal. The control signal introduces a desired phase error between the reference signal and the output signal. Clamping circuits are provided to limit the maximum and minimum magnitudes of the integrated adjusted phase error signal, thereby limiting the maximum and minimum frequencies of the output clock signal.

6 Claims, 2 Drawing Sheets

MASTER CLOCK GENERATOR FOR A PARALLEL VARIABLE SPEED CONSTANT FREQUENCY POWER SYSTEM

BACKGROUND OF THE INVENTION

This invention relates to control circuits for parallel connected electronic power systems and, more particularly, to a master clock generator for a parallel connected variable speed constant frequency power system.

AC electric power systems are usually connected in parallel to increase total system rating or in certain cases such as airborne power systems, to increase reliability. One well known type of aircraft electric power system is the DC link variable speed constant frequency (VSCF) system. Such systems include a plurality of power pole switching elements which synthesize an AC output by switching current from a pair of DC link conductors in a fixed switching pattern, which may be generated by a microprocessor or other digital circuit. When these systems are to be operated in parallel with each other or with another source such as a ground power cart, each of the power sources must be synchronized. Since DC link VSCF systems are clock based, a master clock signal is used to synchronize all of the channels.

No break power transfer (NBPT) is a special case application of a parallel power system which allows momentary paralleling with an external power source. For aircraft applications, the other source is typically an auxiliary power unit (APU) or a ground power unit (GPU). These units are typically constant speed synchronous type generators having a frequency tolerance of at least 5%. Therefore, to provide for no break power transfer, a master clock in the DC link VSCF system must be able to track the frequency of the external power source. An example of such a master clock system is illustrated in U.S. Pat. No. 4,707,142.

For aircraft power system applications, the power system must operate over an extended temperature range. It is therefore desirable to devise a master clock generator which exhibits relatively stable operating characteristics over this temperature range. It is also desirable to provide a master clock generator which is capable of providing a known default output clock signal in the event that a frequency reference signal provided by an external power source goes beyond specified frequency limits.

SUMMARY OF THE INVENTION

A master clock generator for a variable speed constant frequency electric power system constructed in accordance with this invention includes a circuit for selecting a frequency reference signal, a phase comparator for producing a phase error signal representative of the phase difference between the selected frequency reference signal and an output clock signal, a circuit for combining the phase error signal with a control signal to produce an adjusted phase error signal, an integrator/filter for integrating the adjusted phase error signal, a voltage controlled oscillator for producing the output signal in response to the integrated adjusted phase error signal, and user adjustable clamping circuits for limiting the maximum and minimum magnitudes of the integrated adjusted phase error signal, thereby limiting the maximum and minimum frequencies of the output clock signal.

Master clock generators constructed in accordance with this invention provide known default output clock signals in instances where the frequency reference signal supplied by an external power source goes beyond specified frequency limits. In addition, stable operating characteristics is achieved over a wide operating temperature range.

This invention encompasses both master clock generator circuits and the method of generating a master clock signal performed by those circuits.

BRIEF DESCRIPTION OF THE DRAWINGS

The invention will become more readily apparent from the following description of the preferred embodiment thereof, shown by way of example only, in the accompanying drawings wherein.

DESCRIPTION OF THE PREFERRED EMBODIMENT

Figure 1:
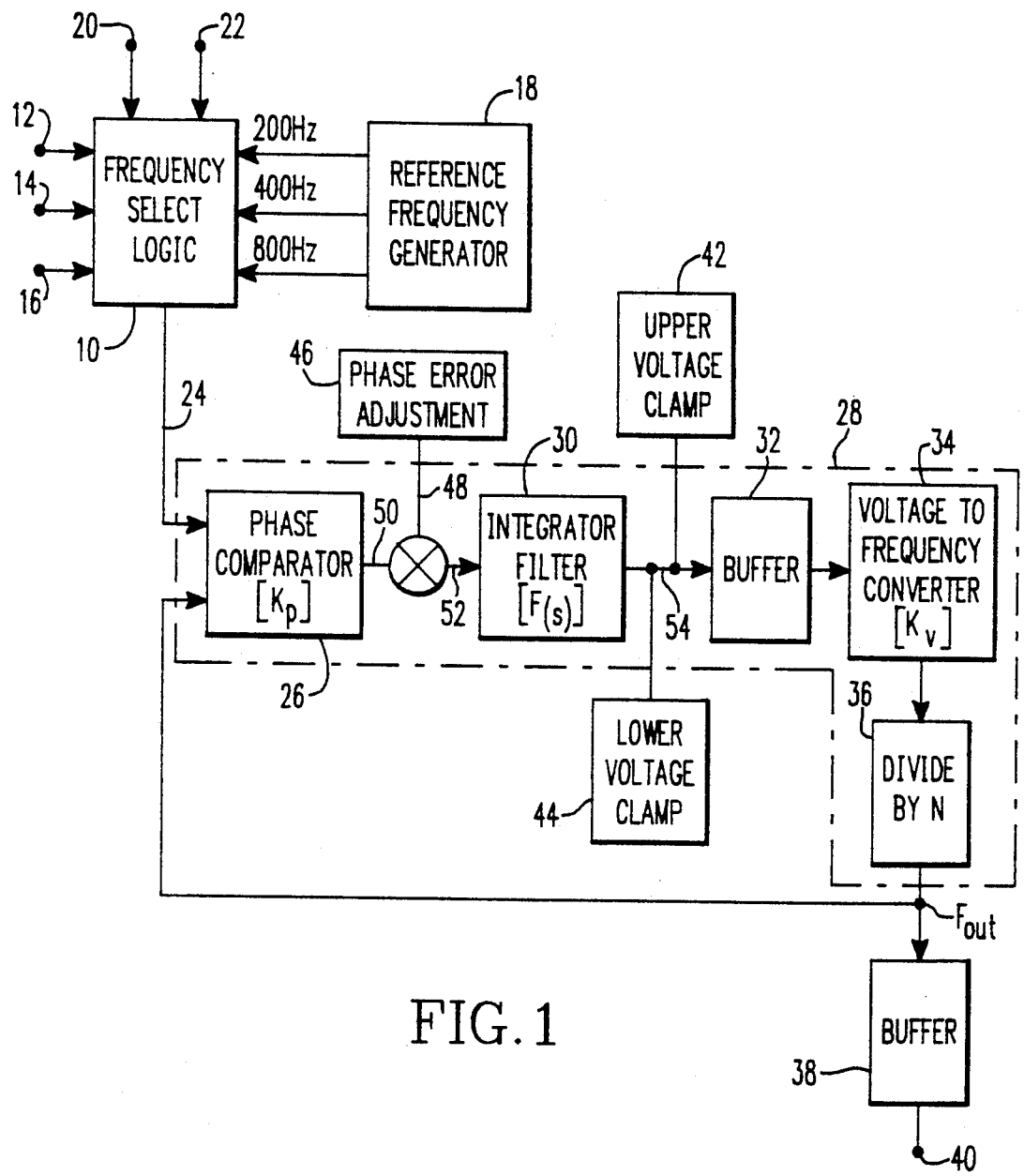
FIG. 1 is a block diagram of a master clock generator constructed in accordance with the preferred embodiment of the present invention.

Referring to the drawings, FIG. 1 is a block diagram of a master clock generator constructed in accordance with the preferred embodiment of the present invention. A frequency selected logic circuit 10 includes a plurality of inputs 12, 14 and 16 for receiving various external frequency reference signals which may be provided by, for example, a ground power unit or an auxiliary power unit when the circuit is used for aircraft applications. In a typical example, these reference signals may be a 30 V peak-to-peak sine wave or a transistor—transistor logic compatible square wave. In addition to the above external references, a reference frequency generator 18 is also provided to supply various internal frequency reference signals, which in the preferred embodiment are 200 Hz, 400 Hz, and 800 Hz unipolar square wave signals. In operation, if the selected frequency reference signal assume some absurd frequency value, the output frequency of the master clock generator is limited to one of two predetermined clamped frequencies. As will be discussed below, the internal reference frequencies of 200 Hz and 800 Hz are used to calibrate the master clock generator upper and lower output clamped frequencies.

The frequency select logic circuit 10 may be implemented by using a programmable logic array in accordance with known design techniques. A pair of input terminals 20 and 22 receive binary logic signals which are used to select the proper internal or external frequency signal as a reference signal. Once selected, the frequency reference signal is passed by way of line 24 to a phase comparator 26. In the preferred embodiment, the phase comparator is constructed in accordance with U.S. Pat. No. 4,849,704, issued Jul. 18, 1989. The phase comparator 26 serves as the input stage to a phase locked loop 28 which includes an integrator/filter 30, a buffer 32, a voltage-to-frequency (V/F) converter 34, and a frequency divide by N circuit 36 connected as illustrated in FIG. 1. Transfer functions for the phase comparator, integrator/filter and V/F converter are shown in brackets in blocks 28, 30 and 34, respectively.

The output frequency of the phase locked loop $F_{out}$ passes through a buffer 38 to become the master clock signal at terminal 40. The phase locked loop ensures that the output signal $F_{out}$ is phase locked (with a user programmed phase error) with the selected input frequency reference signal on line 24. A properly designed phase locked loop will inherently provide the required 50% duty factor for the master clock signal. In the event of a noise glitch or momentary loss of the selected frequency reference signal, the phase locked loop approach provides some "inertia" to the clock signal and thereby prevents severe frequency and/or phase angle transients which might otherwise appear on the parallel bus or upset the paralleling control circuits. Similarly, the transients associated with the change of frequency reference signal are smoothed out by the phase locked loop. Another important feature of this master clock circuit is that if the selected frequency reference assumes an absurd value, such as 0 Hz or 5,000 Hz, the master clock generator is designed to limit the output master clock signal frequency to a frequency range which is within the operating frequency capabilities of the paralleling controls for the VSCF system, for example, 400±40 Hz. The upper and lower frequency limits on the master clock output signal are set through the use of an upper voltage clamp circuit 42 and a lower voltage clamp circuit 44. In practice, it is generally desirable that a VSCF system lead the external power source with which it is about to be paralleled so that the external power source does not deliver power into the VSCF system. This is achieved through the use of a phase error adjustment circuit 46 which produces a control signal on line 48 that is combined with a phase error signal on line 50 to produce an adjusted phase error signal on line 52. The integrator/filter 30 integrates this adjusted phase error signal to produce an integrated adjusted phase error signal on line 54. Upper and lower voltage clamping circuits 42 and 44 act to limit the maximum and minimum magnitude of this integrated adjusted phase error signal.

In typical phase locked loops, the phase error signal from the phase detector is fed directly to the integrator. The feedback loop ensures that no phase error exists between the inputs to the phase detector, thereby driving the phase error signal to zero or some other constant level. In this invention, a control signal (in the form of a DC voltage) is introduced on line 48 and combined with the phase error signal on line 50 to produce a modified phase error signal. The PLL then drives the modified phase error signal to zero or some other constant level by introducing a phase difference between the inputs to the phase detector. This phase difference is representative of the level of the control signal on line 48.

The preferred embodiment of this invention utilizes a second order phase locked loop. A second order phase locked loop has two true integrators within the loop, a voltage controlled oscillator 34 (which includes a built-in integrator) and an integrator/filter 30 after the phase detector. The order of the loop is determined by the transfer function of the integrator/filter. A third, or higher order loop can reduce control oscillator noise substantially, without increasing reference frequency sidebands in the output signal.

The transfer function of a generalized phase locked loop can be represented as follows:

$$\theta_o(s)/\theta_i(s) = G(s)/[1 + G(s)H(s)] \tag{1}$$

where, from FIG. 1, $$G(s) = K_p \cdot F(s) \cdot K_v / s \cdot 1/N \tag{2}$$

for $H(s) = 1$.

In equations (1) and (2), $\theta_o(s)$ is the output signal phase angle in radians; $\theta_i(s)$ is the input signal phase angle in radians; $G(s)$ is the forward transfer function; $H(s)$ is the feedback transfer function; $K_v$ is the voltage controlled oscillator gain in radians per second per volt; $K_p$ is the phase detector gain in volts per radian; $F(s)$ is the gain of the integrator/filter; and N is an integer divisor.

Figure 2:
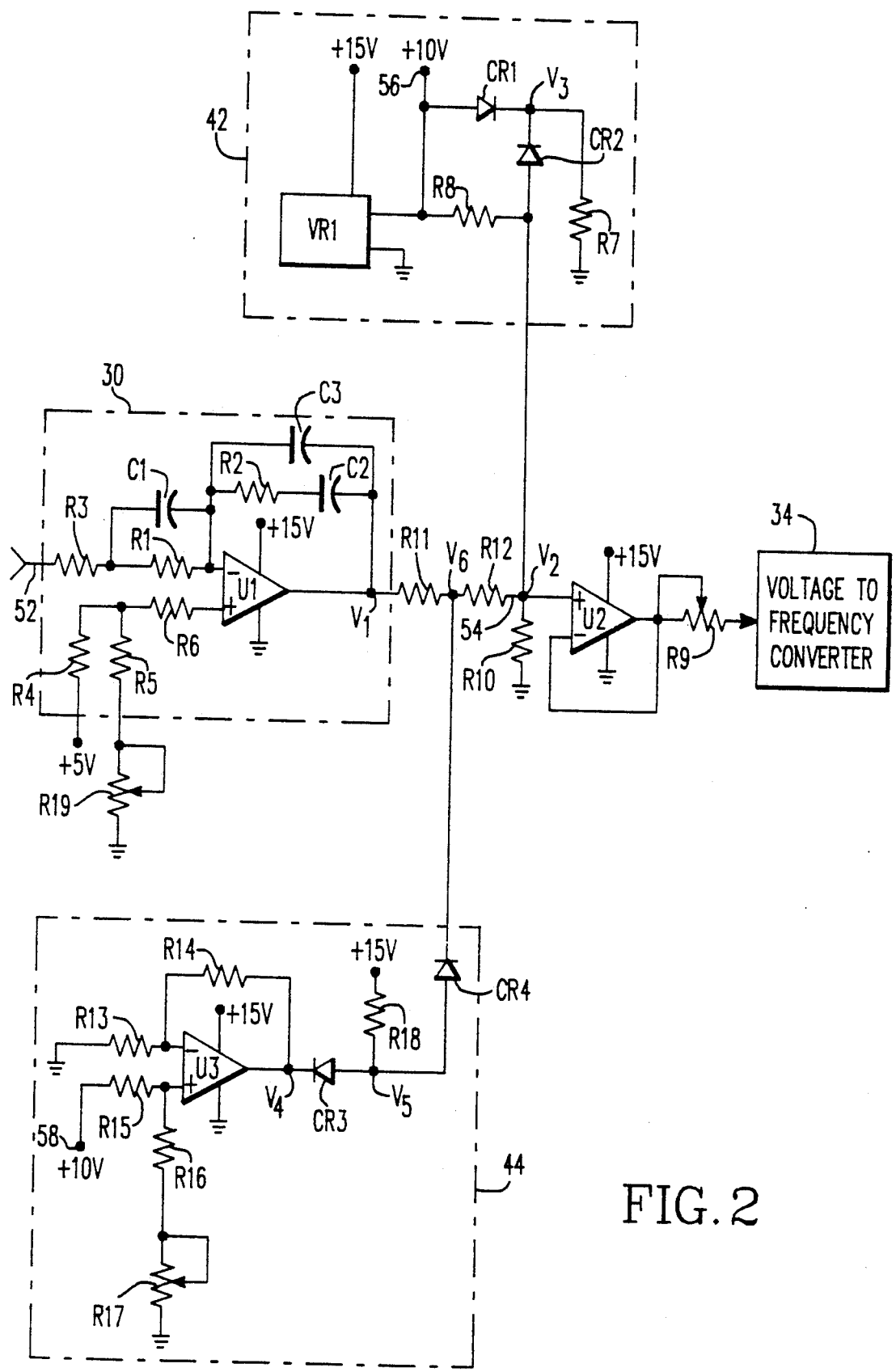
FIG. 2 is a schematic diagram of certain portions of the master clock generator of FIG. 1.

Referring to FIG. 2, the integrator/filter 30 is seen to include amplifier U1; resistors R1, R2, R3, R4, R5 and R6; and capacitors C1, C2, and C3. The transfer function $F(s)$ of this integrator/filter is:

$$F(s) = \frac{-(1 + sC1R1)(1 + sC2R2)}{s(R1 + R3)(C2 + C3)(1 + sR2C2 \| C3)(1 + sC1R1 \| R3)} \tag{3}$$

$$F(s) = -[(1 + sT2)(1 + sT3)]/[sT1(1 + sT4)(1 + sT5)] \tag{4}$$

and the open loop gain of the phase locked loop is:

$$G(s)H(s) = [K_p K_v(1+sT2)(1+sT3)]/[Ns\,T1(1+sT4)(1+sT5)] \tag{5}$$

where:

$$K_p = E_o/\theta = 5\ V/4\pi = 0.398\ V/rad \tag{6}$$

$$K_v = 4\pi \cdot 100\ kHz/10\ V = 62{,}800\ rad/s/V \tag{7}$$

$$N = 256 \tag{8}$$

$$T1 = 12.1\ msec. \tag{9}$$

$$T2 = 3.90\ \mu sec. \tag{10}$$

$$T3 = 56.4\ msec. \tag{11}$$

$$T4 = 2.52\ msec. \tag{12}$$

$$T5 = 2.32\ \mu sec. \tag{13}$$

The component values for the integrator/filter are selected to get the desired transient response with a good phase margin. In the preferred embodiment, the component values are selected to achieve a typical overdamped transient response with a settling time of under 200 milliseconds.

Returning to FIG. 1, the phase comparator 26 is preferably constructed in accordance with U.S. Pat. No. 4,849,704. That phase comparator has only one stable operating point over a 360° angle span, thus eliminating the possibility of phase lock at the wrong angle. An Analog Devices AD650 voltage-to-frequency converter provides the function of block 34 in FIG. 1. The output frequency is typically around 100 kHz. At 100 kHz, it has a maximum nonlinearity of 0.02% and a full scale calibration error of ±150 ppm/°C.

It is desired to be able to set limits for the capturing/tracking range of the phase locked loop. The upper limit of this range is set by upper voltage clamp circuit 42 in FIG. 2, comprising a precision voltage regulator VR1 which supplies a 10 V output at terminal 56, resistors R7 and R8, and diodes CR1 and CR2. The maximum input voltage to the voltage controlled oscillator is clamped by the precision 10 V output of voltage regulator VR1 in combination with diodes CR1 and CR2, and resistor R7. With 10 V supplied at the input of the voltage controlled oscillator, the output upper clamped frequency can be set by adjusting resistor R9 at the output of a buffer amplifier U2.

The lower voltage clamping circuit 44 is connected to a junction point between resistors R11 and R12. The lower voltage clamping circuit receives the precision 10V output of VR1 at terminal 58 and comprises amplifier U3; resistors R13, R14, R15, R16, R17 and R18; and diodes CR3 and CR4. The lower clamped frequency is set by selecting the resistance of resistor R17. Circuit 44 clamps the voltage at the junction of resistors R11 and R12 to a set threshold when the output of the operational amplifier goes below this threshold. The diodes used in the upper and lower frequency clamping circuits are connected in such a way so as to offset variations in their voltage drops due to temperature changes.

Resistors R8, R10, R11 and R12 form a level shifting network such that:

$$V_2 = K_1 + K_2 V_1 \quad (8)$$

where $K_1$ and $K_2$ are constants and $V_1$ and $V_2$ are voltage levels at the points indicated in FIG. 2. $V_2$ is set to make the normal operating point of the PLL near the middle of its linear operating range. Diodes CR1 and CR2 and resistor R7 clamp the maximum $V_2$ voltage in accordance with equations (9), (10), (11) and (12).

$$V_3 = 10 V - V_{CR1} \quad (9)$$

$$V_{2max} = V_3 + V_{CR2} \quad (10)$$

$$V_{2max} = 10 V - V_{CR1} + V_{CR2} \quad (11)$$

$$V_{2max} = 10 V \quad (12)$$

The diode voltage drops $V_{CR1}$ and $V_{CR2}$ cancel each other that any variation in these diode voltage drops due to temperature are canceled out.

Diodes CR3 and CR4, resistor R18 and amplifier U5 set the lower frequency clamp voltage. Voltage $V_4$ is set by amplifier U3, then:

$$V_5 = V_4 + V_{CR3} \quad (13)$$

This clamps the voltage at $V_6$ to:

$$V_{6min} = V_4 + V_{CR3} - V_{CR4} \quad (14)$$

and $$V_{6min} = V_4 \quad (15)$$

Again, diode voltage variations are canceled out.

The upper and lower clamped frequencies are adjusted by selecting the internal frequency reference of 800 Hz and 200 Hz respectively and adjusting resistors R9 and R17 respectively to obtain the desired maximum and minimum output frequencies for the clock signal $F_{out}$. Resistor R19 is used to adjust the phase error between the input and output waveforms of the master clock generator. The accuracy of the frequency clamps and phase error adjustment over the required operating temperature range is dependent on the temperature coefficient of the resistors used in the circuit. Therefore, it is recommended that resistors having a low temperature coefficient are used in the construction of this invention.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A master clock generator for a variable speed constant frequency electric power system comprising:
   means for selecting a frequency reference signal;
   a phase comparator for producing a phase error signal representative of the phase difference between said frequency reference signal and an output clock signal;
   means for combining said phase error signal with a control signal to produce an adjusted phase error signal;
   means for integrating said adjusted phase error signal;
   a voltage controlled oscillator for producing said output signal in response to the integrated adjusted phase error signal;
   means for limiting the maximum magnitude of said integrated adjusted phase error signal, thereby limiting the maximum frequency of said output clock signal; and
   means for limiting the minimum magnitude of said integrated adjusted phase error signal, thereby limiting the minimum frequency of said output clock signal.

2. A master clock generator for a variable speed constant frequency electric power system, as recited in claim 1, wherein said means for limiting the maximum magnitude of said integrated adjusted phase error signal comprises:
   a precision voltage source;
   a resistive voltage divider including first and second resistors electrically connected in series with each other between said precision voltage reference source and ground;
   first and second diodes being reverse series connected in parallel with said first resistor; and
   a third resistor electrically connected between a junction point between said diodes and ground.

3. A master clock generator for a variable speed constant frequency electric power system, as recited in claim 2, wherein said means for limiting the minimum magnitude of said integrated adjusted phase error signal comprises:
   a second voltage divider including fourth and fifth resistors electrically connected in series with each other between said precision voltage source and ground;
   an operational amplifier having a non-inverting input electrically connected to receive a voltage at a junction point between said fourth and fifth resistors;
   third and fourth diodes being reverse series connected between an output of said operational amplifier and an output of said means for integrating said adjusted phase error signal; and
   a sixth resistor electrically connected between a supply voltage and a junction point between said third and fourth diodes.

4. A master clock generator for a variable speed constant frequency electric power system, as recited in claim 1, further comprising:

means for producing first and second ac signals having frequencies above and below said maximum and minimum output frequencies respectively, and for delivering said first and second ac signals to said means for selecting a frequency reference signal.

5. A method for generating a master clock signal for a variable speed constant frequency electric power system, said method comprising the steps of:
  selecting a frequency reference signal;
  producing a phase error signal representative of the phase difference between said frequency reference signal and an output clock signal;
  combining said phase error signal with a control signal to produce an adjusted phase error signal;
  integrating said adjusted phase error signal;
  producing said output signal in response to the integrated adjusted phase error signal;
  limiting the maximum magnitude of said integrated adjusted phase error signal, thereby limiting the maximum frequency of said output clock signal; and
  limiting the minimum magnitude of said integrated adjusted phase error signal, thereby limiting the minimum frequency of said output clock signal.

6. A method for generating a master clock signal for a variable speed constant frequency electric power system, as recited in claim 5, wherein:
  said frequency reference signal has a frequency either above or below said maximum and minimum frequencies of said output signal respectively.

* * * * *